(12) United States Patent  
Rioufrays et al.

(10) Patent No.: US 9,403,196 B2
(45) Date of Patent: Aug. 2, 2016

(54) TREATMENT DEVICE FOR TRANSPORT AND STORAGE BOXES

(75) Inventors: Sylvain Rioufrays, Le Fayet (FR); Erwan Godot, Annecy (FR); Arnaud Favre, Annecy (FR)

(73) Assignee: ADIXEN VACUUM PRODUCTS, Annecy (FR)

( * ) Notice: Subject to any disclaimer, the term of this patent is extended or adjusted under 35 U.S.C. 154(b) by 582 days.

(21) Appl. No.: 13/806,318

(22) PCT Filed: Jun. 27, 2011

(86) PCT No.: PCT/EP2011/060749
§ 371 (c)(1),
(2), (4) Date: Dec. 21, 2012

(87) PCT Pub. No.: WO2012/000950
PCT Pub. Date: Jan. 5, 2012

(65) Prior Publication Data
US 2013/0097802 A1    Apr. 25, 2013

(30) Foreign Application Priority Data

Jun. 29, 2010 (FR) ...................................... 10 55187

(51) Int. Cl.
*B08B 5/04* (2006.01)
*B08B 9/44* (2006.01)
(Continued)

(52) U.S. Cl.
CPC ................ *B08B 5/04* (2013.01); *B08B 9/0821* (2013.01); *B08B 9/44* (2013.01); *H01L 21/6773* (2013.01); *H01L 21/67389* (2013.01)

(58) Field of Classification Search
CPC ....... E06B 3/50; E06B 3/5072; E06B 3/5054; E06B 3/5081; E06B 3/5009; B08B 5/04; B08B 9/44; B08B 9/0821; H01L 21/6773; H01L 21/67389; Y10T 137/86083

USPC ................ 15/304, 306.1, 309.2; 137/565.01, 137/565.17, 565.37, 565.23
See application file for complete search history.

(56) References Cited

U.S. PATENT DOCUMENTS 3,250,038 A * 5/1966 Steel ........................ E06F 3/50
49/341
5,284,412 A   2/1994 Shiraiwa et al.
(Continued)

FOREIGN PATENT DOCUMENTS

CN    1351758 A    5/2002
CN    1631751 A    6/2005
(Continued)

OTHER PUBLICATIONS

International Preliminary Report on Patentability for PCT/EP2011/060749 dated Jan. 8, 2013.
(Continued)

*Primary Examiner* — Steven B McAllister
*Assistant Examiner* — Reginald McNeill, II
(74) *Attorney, Agent, or Firm* — Daly, Crowley, Mofford & Durkee, LLP

(57) ABSTRACT

A treatment device for transport and storage boxes according to the invention comprises a plurality of decontamination modules (24-27) supported by a common chassis (100) and arranged in a row of at least one column (23c) of modules superposed one on top of the other. Each decontamination module (24-27) comprises its own pumping means (6) having at least a primary pump (8a) housed in a primary pumping compartment (8c) that is longitudinally offset from the decontamination chamber (5). Access to the decontamination modules (24-27) is had via side access doors which are all oriented on one and the same access side and which are acted upon by actuating means that automatically close and open them. A lateral transfer zone is provided on the access side, and comprises a robot (29) capable of moving the transport and storage boxes between a frontal loading-unloading station (23a) and the decontamination chambers (5) of each of the decontamination modules (24-27). The amount of space occupied by and the throughput of the treatment device (23) are thus optimized.

20 Claims, 11 Drawing Sheets

(51) Int. Cl.
*B08B 9/08* (2006.01)
*H01L 21/673* (2006.01)
*H01L 21/677* (2006.01)

(56) References Cited

U.S. PATENT DOCUMENTS

| | | | |
|---|---|---|---|
| 5,616,208 | A | 4/1997 | Lee |
| 5,827,118 | A | 10/1998 | Johnson et al. |
| 6,193,601 | B1 | 2/2001 | Torczynski |
| 6,287,023 | B1 | 9/2001 | Yaegashi et al. |
| 6,346,986 | B1 | 2/2002 | Nguyen |
| 6,368,411 | B2 | 4/2002 | Roberson, Jr. et al. |
| 6,422,247 | B2 | 7/2002 | Yoshikawa et al. |
| 7,603,195 | B2 | 10/2009 | Puri et al. |
| 2001/0026355 | A1 | 10/2001 | Aoki et al. |
| 2002/0085183 | A1 | 7/2002 | Wu et al. |
| 2002/0126269 | A1 | 9/2002 | Sato |
| 2002/0192579 | A1 | 12/2002 | Kamono |
| 2003/0150329 | A1 | 8/2003 | Kamono |
| 2004/0023419 | A1 | 2/2004 | Kishkovich et al. |
| 2005/0045209 | A1 | 3/2005 | Tan |
| 2006/0292037 | A1 | 12/2006 | Favre et al. |
| 2007/0035715 | A1 | 2/2007 | Choi et al. |
| 2007/0062561 | A1 | 3/2007 | Koch et al. |
| 2009/0016855 | A1* | 1/2009 | Hofmeister ........ H01L 21/67126 414/220 |
| 2009/0162170 | A1* | 6/2009 | Yamagishi ........ H01L 21/67201 414/217 |
| 2009/0263216 | A1* | 10/2009 | Favre ................ H01L 21/67017 414/222.02 |
| 2010/0021273 | A1* | 1/2010 | Polyak ..................... C23C 14/56 414/217.1 |
| 2010/0065467 | A1* | 3/2010 | Murata .............. H01L 21/67369 206/710 |
| 2010/0282272 | A1 | 11/2010 | Godot et al. |
| 2012/0259449 | A1 | 10/2012 | Favre et al. |
| 2013/0152977 | A1 | 6/2013 | Favre et al. |

FOREIGN PATENT DOCUMENTS

| | | |
|---|---|---|
| CN | 101071760 A | 11/2007 |
| DE | 4237767 A1 | 5/1999 |
| EP | 0 582 019 A1 | 2/1994 |
| EP | 1703547 A2 | 9/2006 |
| EP | 1 724 474 A1 | 11/2006 |
| FR | 2908674 A1 | 5/2008 |
| JP | H05-007720 A | 1/1993 |
| JP | H 0786187 A | 3/1995 |
| JP | H11-168135 | 6/1999 |
| JP | 2001-267200 | 9/2001 |
| JP | 2001-267200 A | 9/2001 |
| JP | 2002-372777 A | 12/2002 |
| JP | 2004/047929 A | 2/2004 |
| JP | 2005-093697 A | 4/2004 |
| JP | 2009/538000 | 10/2009 |
| JP | 2010/040979 A | 2/2010 |
| TW | 2004/26971 A | 12/2004 |
| TW | I275911 B | 3/2007 |
| WO | WO 99/45576 | 9/1999 |
| WO | WO 0116653 A1 | 3/2001 |
| WO | WO 03/034475 A1 | 4/2003 |
| WO | WO 0304475 A1 | 4/2003 |
| WO | WO 2004/097927 A1 | 11/2004 |
| WO | WO 2007/033257 A2 | 3/2007 |
| WO | WO 2007/135347 A1 | 11/2007 |
| WO | WO 2009-021941 A1 | 2/2009 |

OTHER PUBLICATIONS

Written Opinion of the ISA for PCT/EP2011/060749 dated Aug. 19, 2011.
French Search Report and Written Opinion of the ISA for FR1055187 dated Sep. 15, 2010.
Chinese Office Action, with translation, for Appl. No. 201180032234.9 dated Mar. 28, 2014.
Chinese Office Action, with translation, for Appl. No. 201180032234.9 dated Dec. 12, 2014.
Translation of Taiwanese Office Action for Appl. No. 100121841 dated Jun. 30, 2015.
International Search Report of the ISA for PCT/EP2011/060749 dated Aug. 19, 2011.
Translation of Japanese Office Action dated Apr. 28, 2015 for Appl. No. 2013-517235; 5 pages.
Office Action dated Mar. 9, 2016 for U.S. Appl. No. 13/819,409; 22 pages.
Chinese Office Action with English translation dated Dec. 5, 2014; For Chinese Pat. App. No. 2011/80032234.9; 7 pages.
Chinese Office Action with English translation dated Mar. 28, 2014; For Chinese Pat. App. No. 2011/80032234.9; 9 pages.
INPI Preliminary Search Report dated Sep. 15, 2010; For French Pat. App. No. FR 1055187; 7 pages.
Japanese Notice of Reasons for Rejection English translation dated Apr. 28, 2015; For Japanese Pat. App. No. 2013-517235; 4 pages.
Japanese Notice of Reasons for Rejection with English translation dated May 7, 2015 for Japanese Pat. Appl. No. 2012-543768; 7 pages.
PCT International Search Report of the ISA with English Translation for PCT/EP2010/069973 dated Apr. 14, 2011; 7 pages.
PCT International Search Report with English translation dated Aug. 19, 2011; For PCT App. No. PCT/EP2011/060749; 8 pages.
PCT Written Opinion of the ISA International with English translation dated Aug. 19, 2011; For PCT Pat. App. No. PCT/EP2011/060749; 15 pages.
Taiwanese Office Action translation dated Jun. 30, 2015; For Pat. App. No. 100121841; 6 pages.
Translation of Japanese Notice of Reasons for Rejection for Japanese Appl. No. 2013-527580 dated Feb. 9, 2016 and partial translation of cited Reference 1 (aka WO 0304475 A1); 9 pages.
Office Action dated Oct. 23, 2014; For U.S. Appl. No. 13/516,376; 25 pages.
Response dated Jan. 22, 2015 to Office Action dated Oct. 23, 2014; For U.S. Appl. No. 13/516,376; 22 pages.
Applicant Initiated Interview Summary dated Jan. 26, 2015; For U.S. Appl. No. 13/516,376; 3 pages.
Final Office Action dated Feb. 25, 2015; For U.S. Appl. 13/516,376; 38 pages.
Notice of Appeal dated May 26, 2015; For U.S. Appl. No. 13/516,376; 2 pages.
Appeal Brief dated Oct. 23, 2015; For U.S. Appl. No. 13/516,376; 25 pages.
Restriction Requirement dated Nov. 4, 2015; For U.S. Appl. No. 13/819,408; 8 pages.
Response dated Nov. 30, 2015 to Restriction Requirement dated Nov. 4, 2015; For U.S. Appl. No. 13/819,408; 4 pages.
INPI Preliminary Search Report dated Nov. 8, 2007; For French Pat. App. No. FR693013; 3 pages.
Japanese Notice of Reasons for Rejection English translation dated Jun. 30, 2015; For Japanese Pat. No. 2013-527580; 18 pages.
Taiwanese Office Action English translation; For Taiwanese Pat. App. No. 099143728; 5 pages.
Taiwanese Office Action dated Jul. 13, 2015 with English translation; For Taiwanese Pat. App. No. 100132232; 15 pages.
PCT Search Report with English translation with International Filing Date of Dec. 16, 2010; For PCT Pat. App. No. PCT/EP2010/069973; 7 pages.
PCT International Search Report dated Dec. 13, 2011; For PCT Pat. App. No. PCT/EP2011/065408; 3 pages.
PCT International Preliminary Report on Patentability and Written Opinion of the ISA dated Mar. 21, 2013; For PCT Pat. App. No. PCT/EP2011/065408; 7 pages.
Response to Feb. 25, 2015 Office Action as filed on May 24, 2016 for U.S. Appl. No. 13/516,376; 8 pages.
RCE filed May 24, 2016 for U.S. Appl. No. 13/516,376; 3 pages.

* cited by examiner

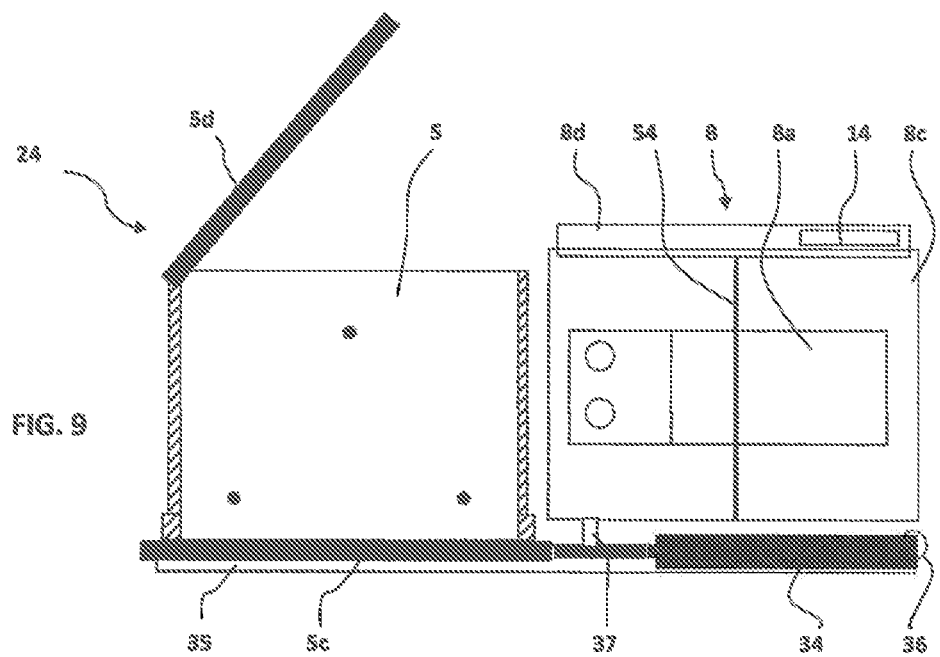
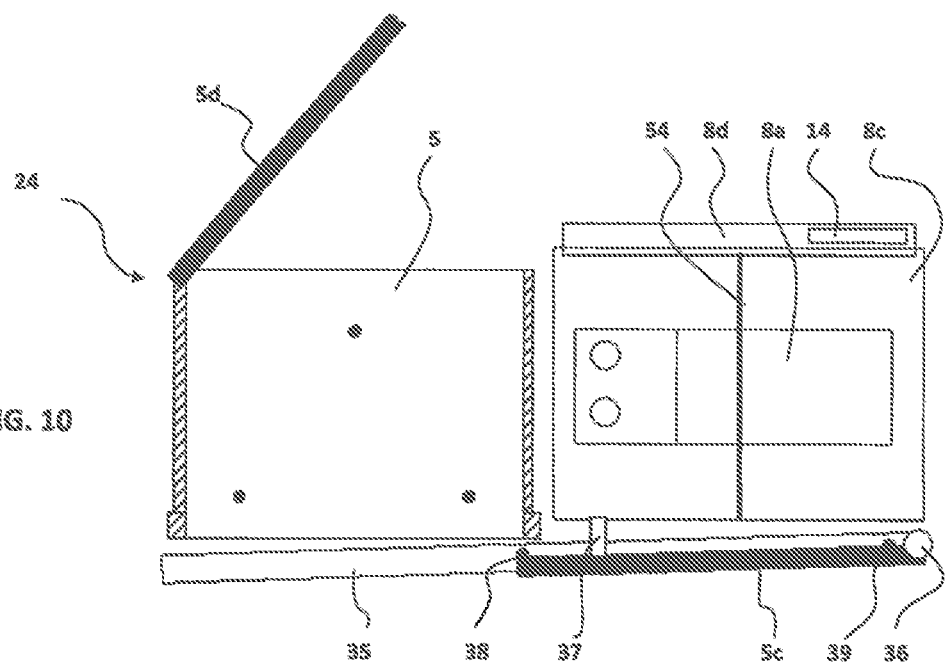

TREATMENT DEVICE FOR TRANSPORT AND STORAGE BOXES

CROSS REFERENCE TO RELATED APPLICATIONS

This application is a U.S. National Stage application of PCT/EP2011/060749 filed in the French language on Jun. 27, 2011 and entitled "TREATMENT DEVICE FOR TRANSPORT AND STORAGE BOXES" which claims priority to French application FR1055187 filed on Jun. 29, 2010.

The present invention relates to the devices used for cleaning and decontaminating the transport and storage boxes used for semiconductor substrates or photomasks.

In a facility that manufactures semiconductors, substrates such as semiconductor wafers and/or masks undergo treatments in process chambers. These treatments include various steps performed in different tools, such as steps of depositing material or etching steps for example. Between each step, the substrates are placed in transport and storage boxes which are themselves moved between the various tools in the semiconductor manufacturing facility. The time spent waiting during transfers between tools may be long, typically lasting a few hours. The transport and storage boxes therefore serve as means for storing the substrates during the waiting times.

At the present time, the lots of substrates are contained in mini environments consisting of transport and storage boxes, notably such as the side opening or front opening unified transport pods known as FOUP (front opening universal pods) or bottom-opening standardized transport and storage pods known as SMIF (standard mechanical interface) pods.

During the storage steps, particulate contamination carded in the air (or AMC which stands for airborne molecular contamination), which results from the presence of reactive gases in the atmosphere inside the transport and storage boxes, reacts with the substrates and creates defects. These defects may make the semiconductor wafers unusable and cause the semiconductor manufacturing facilities considerable productivity losses. They are then responsible for expensive losses of semiconductor wafers when the defect is not detected until after treatment.

In order to avoid these drops in productivity of the semiconductor manufacturing facilities and the losses of semiconductor wafers already treated, proposals have been made for the transport and storage boxes, and the lot of substrates they contain, to be decontaminated using a method and a module for the decontamination of confined environments. A decontamination module usually comprises a decontamination chamber with a side access door capable of containing a single transport and storage box. The decontamination performed using such a module may last several hours.

One single module is therefore not capable of treating, under acceptable conditions, the high number of transport and storage boxes used in a semiconductor manufacturing facility.

One idea might be to increase the number of modules in the semiconductor manufacturing facility, so that the required throughput for decontamination of transport and storage boxes can be achieved. However, the disadvantage with this is that the space occupied by the decontamination modules, particularly the floor space they occupy, is likewise increased. Specifically, these decontamination modules are located in the clean room of the semiconductor manufacturing facility and clean room floor area represents a high investment and operating cost. At the same time, the layout of the decontamination modules has to be compatible with the Overhead Hoist Transport (OHT) system used for transporting the boxes in a semiconductor manufacturing facility.

Thus the present invention aims first of all to reduce the floor space occupied by the decontamination means.

Another object of the invention is to ensure that the decontamination means are compatible with the standardized overhead hoist transport (OHT) system used for transporting the boxes in a semiconductor manufacturing facility.

Another object of the present invention is to ensure that the decontamination modules are independent and operate in exactly the same way. The goal is to collect together several decontamination modules and arrange them in one and the same compact treatment device.

Another object of the invention is to meet environmental standards, particularly noise standards, as well as safety standards.

Because the number of decontamination modules is multiplied in order to create a single treatment device, compliance with noise standards entails confining the device inside an acoustically insulating chassis. However, the acoustic insulating means necessarily have a thermal insulating capability, which encourages the components of the treatment device to heat up, which heating is liable to damage these components. It is therefore necessary to provide means for avoiding excessive heating, and this is another object of the present invention.

Another difficulty in permanently maintaining a sufficient treatment capacity is that of allowing individual maintenance of the decontamination modules that make up the treatment device, allowing maintenance to be carried out on one module without affecting the operation of the other modules.

Moreover, the invention aims to minimize the cost of producing such a treatment device, notably the cost of the means that handle the transport and storage boxes within the device.

One subject of the present invention is a treatment device for transport and storage boxes, comprising a decontamination module that has:
  a decontamination chamber with a side access door which is capable of containing a transport and storage box,
  means of introducing gas into the decontamination chamber,
  means of pumping the gases from the decontamination chamber,
  command and control means for controlling the gaseous atmosphere within the decontamination chamber.

The device according to the invention comprises:
  a plurality of decontamination modules supported by a common chassis; the decontamination modules being superposed on one another to form at least one column of modules,
  each decontamination module comprises its own pumping means having at least a primary pump,
    the primary pump is housed in a primary pumping compartment that is longitudinally offset with respect to the decontamination chamber.

In that way, each decontamination module is independent of the other modules and a significant space saving is made in the vertical direction and in the transverse direction, and the decontamination modules are interchangeable in use because their performance is identical.

For preference, the primary pump is supported by the common chassis with interposition of elastic connecting means preventing the transmission of vibration to the decontamination enclosure.

Such an arrangement may be particularly beneficial when the vacuum pumps are located in the upper levels of the treatment device, because any transmission of vibration from the pumps could give rise to resonance that causes vibration and defects in the semiconductor wafers contained in the transport end storage boxes.

Compliance with noise standards means that the walls of the primary pumping compartments need to comprise absorbent panels for acoustic insulation. In this event in particular, the thermal insulation that results from this means that special means have to be provided to avoid heating.

Thus, preferably it is ensured that:
the primary pumping compartments of the decontamination modules of one and the same column of modules communicate with one another with no horizontal separation,
each primary pump comprises an air cooling system with a cooling air intake at a first end of the pump and with a cooling air discharge at a second end of the pump,
in one and the same column of modules, an intermediate vertical wall separates one from the other:
a first pumping compartment zone receiving all the cooling air discharges and comprising a lower air outlet, and
a second pumping compartment zone containing all the cooling air intakes and comprising an upper ambient air inlet.

The air flows that result from this arrangement allow the heating resulting from operation of the primary pumps to be reduced very substantially so that all of the components of the treatment device are kept at a satisfactory temperature.

According to one embodiment, it is ensured that:
the side access doors to the decontamination modules are all oriented along one and the same access side and are each controlled by actuating means which open and close them,
a lateral transfer one is provided on the access side and comprises a robot capable of moving the transport and storage boxes between a frontal loading-unloading station and the decontamination chamber of each of the decontamination modules.

Thanks to the fact that several modules are superposed in a column, and to the fact that the columns of modules are arranged in a line in a longitudinal row of columns, the transverse size of the treatment device is limited to the width of one decontamination module increased by the width of the lateral transfer zone containing the robot. This transverse size defines the length occupied by the treatment device in the path defined by the box overhead hoist transport (OHT) system.

At the same time, the vertical space occupancy of the treatment device can be optimized to suit the height available in the semiconductor manufacturing facility.

Finally, the longitudinal occupancy of the treatment device can be optimized to suit the length available in a semiconductor manufacturing facility bay between two successive spans of the box overhead hoist transport (OHT) system, by a suitable choice of the number of columns of modules arranged in a line.

According to an alternative, it is ensured the side access door of each decontamination module is a sliding access door which, when open, is laterally offset to the side of the primary pumping compartment and which is controlled by a sliding actuator.

The sliding nature of the side access doors avoids any risk of damage to the robot and to the doors when the sliding of the doors is outside of the lateral transfer zone occupied by the robot.

At the same time, the sliding movement of the door is parallel to the lateral transfer zone, between the decontamination chamber and the primary pumping compartment, without increasing the amount of space occupied by the decontamination module. This yields a significant space saving.

For preference, the sliding access door is mounted to slide longitudinally on a frame itself mounted with pivoting about a vertical axis of pivoting and made to pivot by a pivoting actuator.

This arrangement makes it possible in a simple way to ensure that the access door seals well and at the same time makes it possible to reduce seal friction, which friction is liable to release contaminating particles the presence of which would be particularly detrimental in a semiconductor manufacturing facility clean room.

According to another embodiment, each decontamination chamber of the decontamination modules comprises, on the opposite side to the access side, a maintenance door that can be opened by an operator so that individual maintenance can be carried out on one decontamination module. Thus, an operator can perform individual maintenance on one decontamination module without affecting the operation of the other modules or the operation of the robot.

For preference, each decontamination module comprises a safety device which:
locks the maintenance door if the side access door is opened,
locks the side access door and partially disables the robot if the maintenance door is opened.

This then guarantees the safety of the operators tasked with carrying out maintenance and avoids any risk of damage to the robot or degradation of the content of the transport and storage boxes during maintenance on at least one decontamination module.

The device according to yet another embodiment further comprises:
at least one first loading-unloading station,
a lateral transfer zone provided on the side of the access to the decontamination modules, in line with the loading-unloading station,
a robot, placed in the lateral transfer zone, capable of moving the transport and storage boxes between the frontal loading-unloading station and the decontamination chamber of each of the decontamination modules.

The overall architecture of the treatment device as defined hereinabove makes it possible to provide a robot that is particularly simple and inexpensive, for example a robot of a type comprising:
longitudinal-translation means,
vertical-translation means,
means of rotating through 90° about a vertical axis,
a radially extending arm.

Particularly in the case where there are a great many columns of modules arranged in lines in a longitudinal row, it is necessary to provide loading-unloading means that offer sufficient throughput that the operation of the other components of the treatment device is not delayed. To do that, provision may advantageously be made for the device to comprise:
a first loading-unloading station, in line with the lateral transfer zone,
a second loading-unloading station, in line with the longitudinal row of columns of modules and comprising means of longitudinal movement and means of rotating through 90° about a vertical axis.

This then doubles the loading-unloading capacity, allowing loading-unloading operations to be performed in parallel time, without slowing down the robot.

In order to comply with safety standards, each loading-unloading station may advantageously comprise a safety airlock.

For preference, it is also ensured that:

each decontamination module comprises its own control means, the control means are arranged in a control panel positioned to the side on the same side as the primary pumping compartment.

The control means positioned laterally on the primary pumping compartment side make it possible to avoid any increase in the space required by the decontamination module. This then affords a significant space saving.

In general, the decontamination modules entail the use of a primary pump and of a secondary pump, allowing pumping in two successive steps, namely a primary pumping step during which the primary pump is connected to the decontamination chamber, and a strong vacuum pumping step during which the secondary pump is interposed between the decontamination chamber and the suction side of the primary pump.

In this case, provision may advantageously be made for each decontamination module to comprise a secondary pump housed above the decontamination chamber.

In order to use small size secondary pumps (for example of the "ATH 31" type of the "ADIXEN" make or equivalent), provision may advantageously be made for the secondary pumps each to be associated with a permanent purge device and with a selective coupling device which:

couples each of them to the respective primary pump of their decontamination module during the steps in which the pumps create a strong vacuum in the decontamination chamber or during the standby steps, couples ail of them to one and the same common primary pump during the primary pumping steps.

The permanent purge and the presence of the common primary pump allow the secondary pumps to be kept in constant operation, avoiding any increase in concentration of harmful gases that could degrade and destroy the secondary pumps.

Other objects, features and advantages of the present invention will become apparent from the following description of some embodiments, which is given with reference to the attached figures in which:

FIG. 1 schematically illustrates a treatment device for transport and storage boxes according to one embodiment of the present invention;

FIG. 2 is a plan view illustrating the overall layout of a semiconductor manufacturing facility;

FIG. 3 schematically illustrates, in a plan view, the position of a treatment device for transport and storage boxes, according to one embodiment of the present invention;

FIGS. 9 and 10 illustrate another embodiment of the kinematics governing the movement of the doors of a decontamination chamber of the treatment device of FIGS. 6 and 7;

Figure 1:
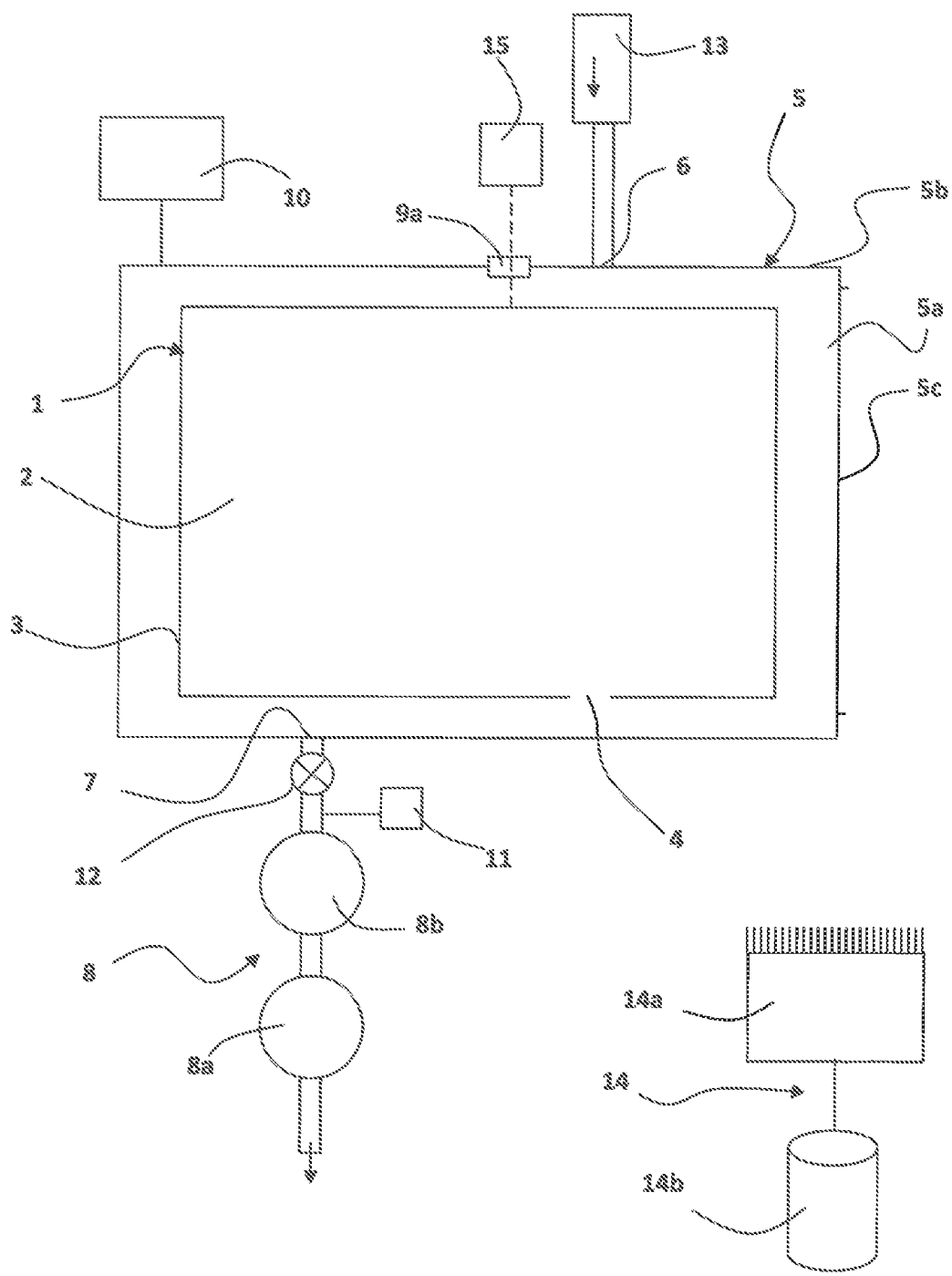

Reference is made first of all to FIG. 1 which illustrates a transport and storage box 1, defining a non-fluidtight confined environment in the form of a volume 2 bounded by a wall 3 and comprising a leak 4. The wall 3 is generally made of polycarbonate.

A decontamination chamber 5 has an interior volume 5a just a little greater than the volume of the transport and storage box 1. The decontamination chamber 5 comprises a fluidtight peripheral wall 5b, with an access door 5c allowing the transport and storage box 1 to be introduced and removed. The wall 5b of the decontamination chamber 5 is, for example, made of stainless steel with a polished interior surface, capable of withstanding a vacuum of one atmosphere. The interior polishing prevents the degassing of the peripheral wall 5b during vacuum decontamination operations.

An inlet 6 allows a gaseous flow from a source of treatment gas 13 to be introduced into the decontamination chamber 5, while an outlet 7 connected to gas pumping means 8 allows a vacuum to be created inside the decontamination chamber 5.

The pumping means 8 comprise at least one primary pumping unit 8a, and advantageously also a secondary pumping unit 8b, for example of the turbomolecular, molecular or hybrid type.

In the embodiment illustrated, the decontamination chamber 5 is associated with a pressure sensor 10, with an isolation valve 12 coupled in the pumping line in series with the pumping means 8, a source of treatment gas 13 coupled to the inlet 6, a degassing flow sensor 11, control means 14 and a deformation sensor 15.

The control means 14 may comprise a processor 14a associated with a memory 14b in which control programs are loaded. The processor 14a may receive data from the various sensors such as the pressure sensor 10, the deformation sensor 15, the degassing flow sensor 11.

At output, the processor 14a is connected in a way known per se to various actuators able to act on the isolation valve 12, on the motors that drive the primary pump 8a and the second pump 8b, on a valve that controls the flow rate of the stream of gas passing through the gas introduction means 6, 13.

The deformation sensor 15 comprises a laser emitter/receiver which, through the viewing port 9a, detects the distance separating it from the wall 3 of the transport and storage box 1. Thus, the deformation sensor 15 can be used both for detecting the deformation of the transport and storage box 1 during a decontamination operation and to detect the presence, absence or correct positioning of a transport and storage box 1 in the decontamination chamber 5.

The way in which such a decontamination chamber 5 works is, for example, described in document WO-2007/135 347.

Figure 2:
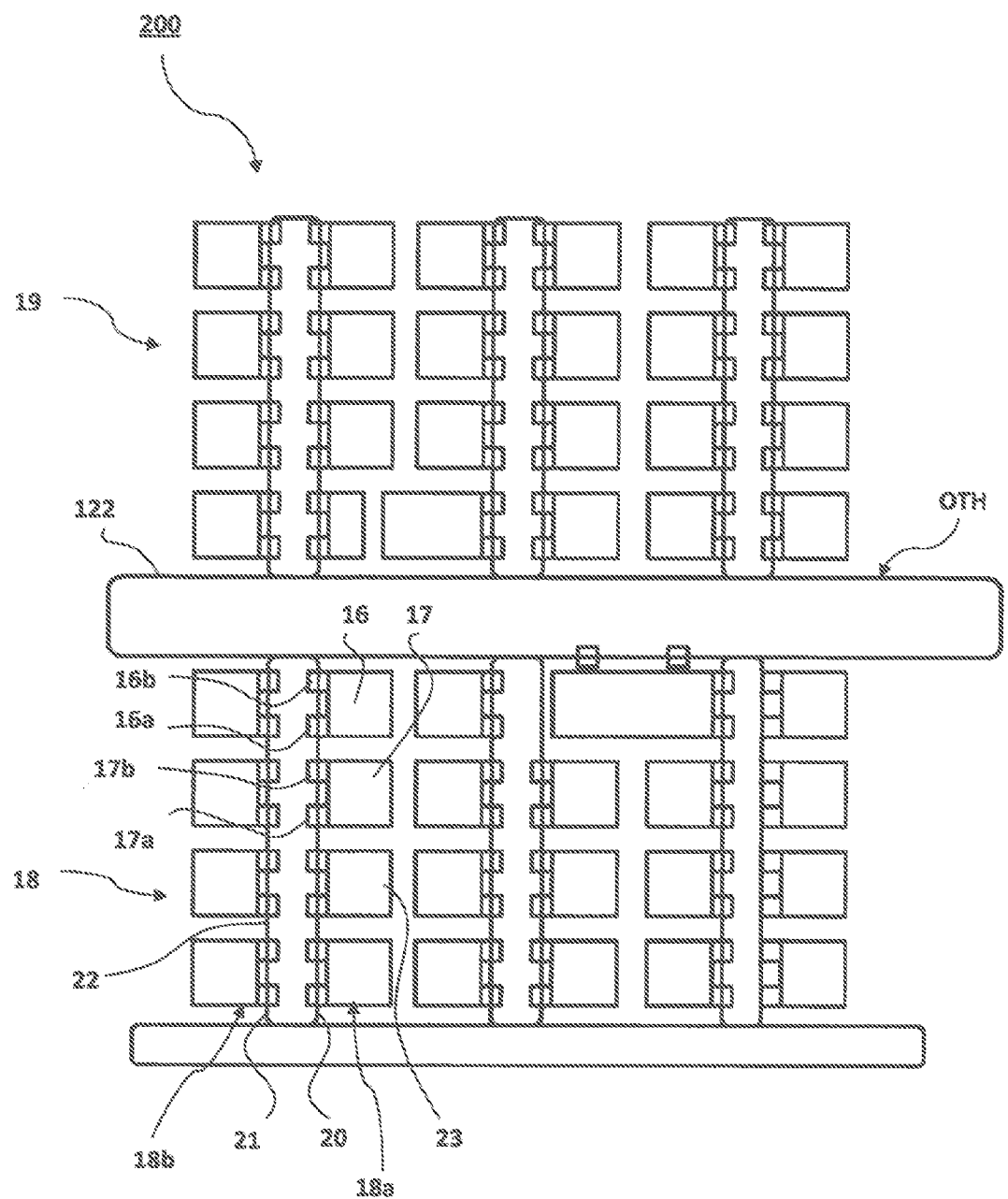

Reference is now made to FIG. 2 which illustrates the overall organization of part of a semiconductor manufacturing facility 200.

Methods of manufacturing semiconductors comprise a great may successive steps and so the semiconductor manufacturing facility 200 comprises a great many work stations which are known as "tools".

Thus, FIG. 2 illustrates a set of forty-seven tools, such as the tools 16 and 17, arranged in two regions or bays 18 and 19 of six rows each, such as the rows 18a and 18b. Each tool 16 or 17 comprises, on one and the same side, a first loading-unloading station 16a or 17a and a second loading-unloading station 16b or 17b. Thus, in a row such as the row 18a of tools 16 and 17, loading and unloading stations are aligned along one branch 20 of the box transport system OHT, which itself comprises guiderails, usually situated in the roof of the facility, and which follow a standardized path.

The box transport system OHT has a branch 20 or 21 for each row 18a or 18b of tools 16, 17. The branches 20 and 21 are coupled in pairs in a loop known as the "intra-bay" loop such as the loop 22 formed for example by the branches 20 and 21 of two successive rows 18a and 18b. A loop known as an "extra bay" loop 122 extends between the two successive regions 18 and 19, and supplies the "intra bay" loops such as the loop 22.

The box transport system OHT moves the transport and storage boxes 1, containing the semiconductor wafers or masks that are to be treated, distributes the transport and storage boxes 1 to the tools 16 or 17 which perform the planned treatment on their contents, and then collects the transport and storage boxes 1 after treatment.

According to the invention, a treatment device 23 is provided for treating the transport and storage boxes 1 and/or the contents thereof which device is structured and sized so that it occupies a space of the same order of magnitude as the conventional tools 16, 17 found in a semiconductor manufacturing facility 200, and so that they are compatible with the box transport system OHT.

For that, the treatment device 23 according to the invention is able to take the place of one of the tools 16, 17 as illustrated in FIG. 2.

Consider, for example, the embodiment illustrated in FIG. 3, in which we again have the tools 16 and 17 and the branch 20 of the box transport system OHT.

The treatment device 23 is located in the same row of tools 18a as the tools 16 and 17. It can be seen that the floor space occupied by the treatment device 23 is similar to the floor space occupied by the tool 16. In this treatment device 23 it is possible to make out two loading-unloading stations 23a and 23b capable of collaborating with the branch 20 of the box transport system OHT. It is also possible to make out a first module of columns 23c and a second column of modules 23d, which is optional.

According to the invention, the treatment device 23 make comprise several columns of modules, such as the column of modules 23c, each having a superposition of four decontamination modules each consisting of a decontamination chamber 5 associated with its own means 6, 13 of introducing gas, its own pumping means 8 and with its own control means 14.

Figure 6:
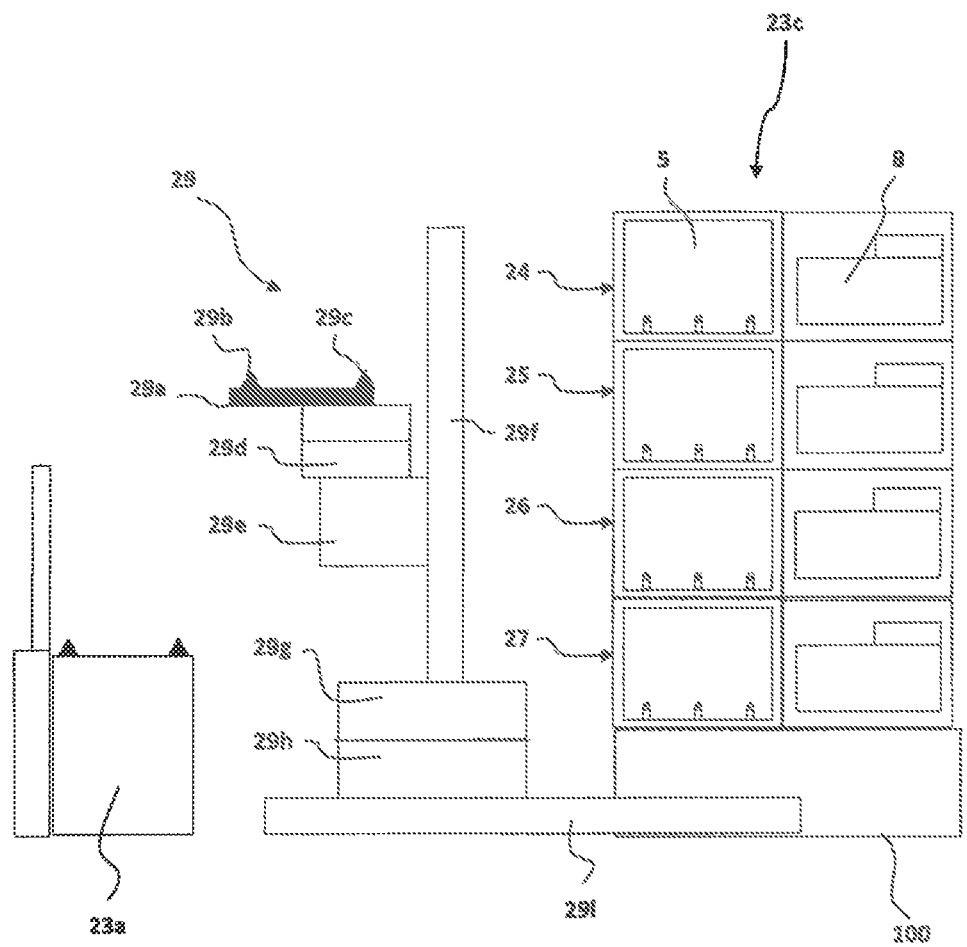
FIG. 6 is a schematic side view illustrating the overall architecture of a treatment device for transport and storage boxes according to an embodiment of the invention that employs four decontamination modules.
Figure 7:
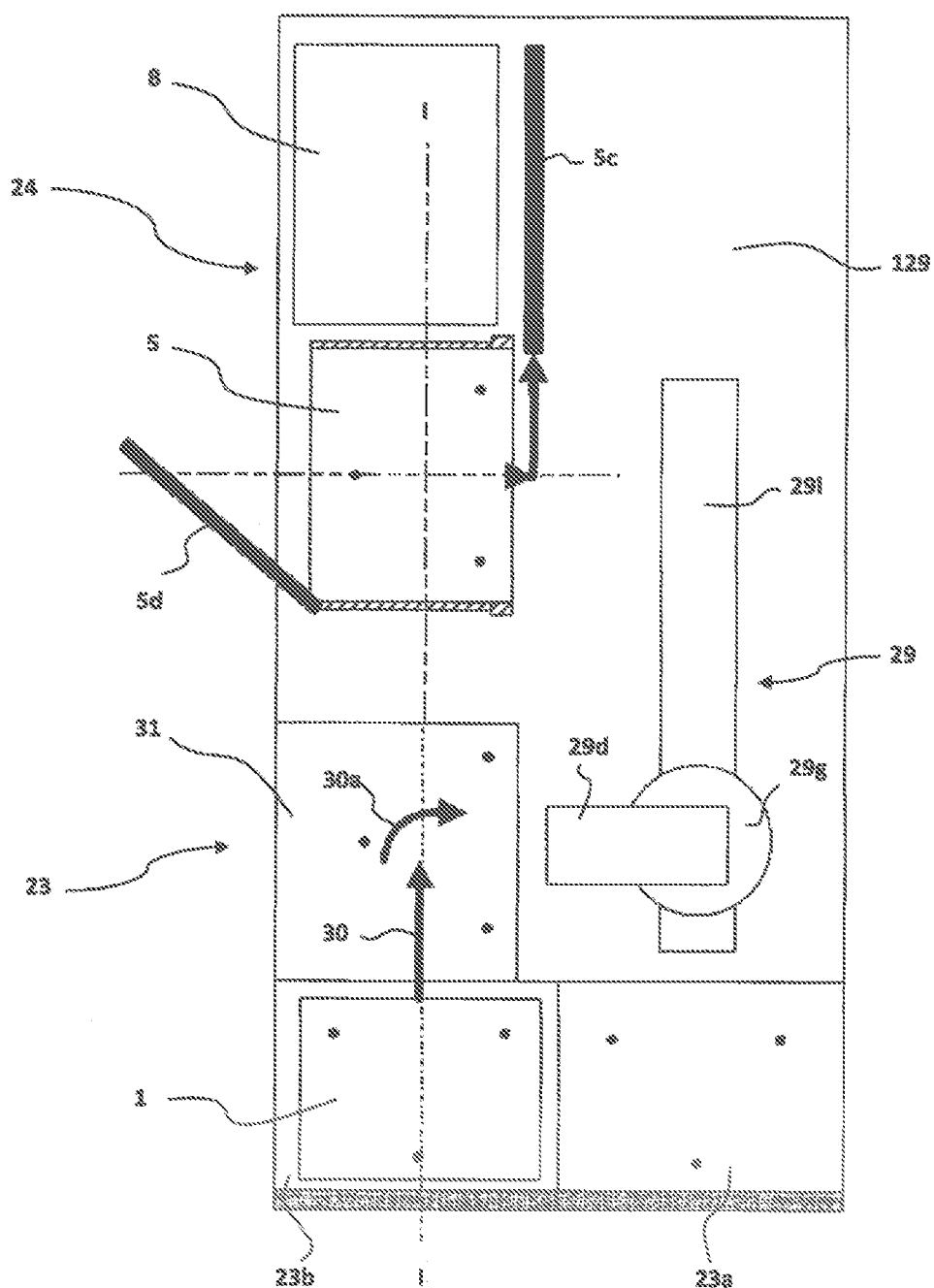
FIG. 7 is a schematic plan view of the treatment device of FIG. 6.

Reference is now made to FIGS. 6 and 7 which illustrate, in a side view and a plan view respectively, a treatment device 23 according to the invention in an embodiment that comprises just one column of modules 23c.

Thus, the treatment device 23 comprises, in this embodiment, four decontamination modules 24, 25, 26 and 27, vertically superposed on one another to form the column of modules 23c.

Each decontamination module comprises a decontamination chamber 5, pumping means 8, and various ancillary means illustrated in FIG. 1 but not repeated in FIGS. 6 and 7 in order to make the latter easier to understand.

The decontamination chamber 5 of a module comprises a side access door 5c. In the treatment device 23, all the side access doors 5c of the decontamination modules 24-27 are oriented along one and the same access side (to the right in FIG. 7) and are each acted upon by actuating means that open and close them. On the opposite side to the access side, the decontamination chamber 5 comprises a maintenance door 5d, that an operator can open in order to carry out individual maintenance on one decontamination module.

As may be seen from these FIGS. 6 and 7, in a decontamination module such as the module 24, the decontamination chamber 5 is in line on one and the same level with the pumping means 8, and in FIG. 7, the whole set is in line in the longitudinal direction I-I with one of the loading-unloading stations 23b. The whole set occupies half of the transverse space of the treatment device 23, namely the left-hand half in FIG. 7. The right-hand half is occupied firstly by the second loading-unloading station 23a and by a lateral transfer zone 129, situated on the same side as the access to the decontamination chambers 5 and containing a common box transfer robot 29.

The robot 29 is designed to move the transport and storage boxes 1 between each of the loading-unloading stations 23a and 23b and the decontamination chambers 5 of each of the decontamination modules 24-27.

To do that, the robot 29 comprises a support 29a with three upper pins such as the pins 29b and 29c, arranged in a triangle in a layout that corresponds to the standardized support points for a transport and storage box 1.

The support 29a is mounted at the end of a radially extensible arm 29d that allows it to be moved horizontally, and is itself mounted on a carriage 29e capable of vertical movement along a vertical guide 29f. The vertical guide 29f is itself mounted on a turntable 29g that can rotate about a vertical axis through an amplitude of 90°, supported by a lower carriage 29h itself mounted so that it can slide longitudinally along the longitudinal guide 29i. The vertical guide 29f is of a height such that it is able to bring the support 29a up to the height of each of the decontamination chambers 5 of the decontamination modules 24-27. The longitudinal guide 29i allows the lower carriage 29h to be moved longitudinally so as to bring the support 29a either to face the loading-unloading station 23a or to face the decontamination chambers 5 of the decontamination modules 24-27.

To transfer a transport and storage box 1 between the robot 29 and the loading-unloading station 23b there is a transfer device which, on the one hand, allows the box support to be moved linearly as illustrated by the arrow 30 between the loading unloading station 23b and an intermediate station 31 then allows the intermediate station to be rotated through 90° about a vertical axis, as illustrated by the arrow 30a. Next, the arm 29d of the robot 29 can pick up or sit down the transport and storage box 1 from or onto the intermediate station 31. The structure of the robot 29 is thus compatible, with no complex modification, with the presence of two loading-unloading stations 23a and 23b.

The transport and storage boxes 1 may be loaded onto the loading-unloading stations 23a and 23b either automatically by the robot 29 of the facility box transfer system OHT or manually by an operator. Automatic loading presents no safety problems. By contrast, manual loading entails the provision, at the loading-unloading stations 23a and 23b, of two doors which belong to loading-unloading airlocks: an outer door on the operator side and an inner door on the robot side. The command and control device manages the safe opening and closing of the two doors, not allowing the outer door to be opened while the inner door is open, and vice versa.

Figure 8:
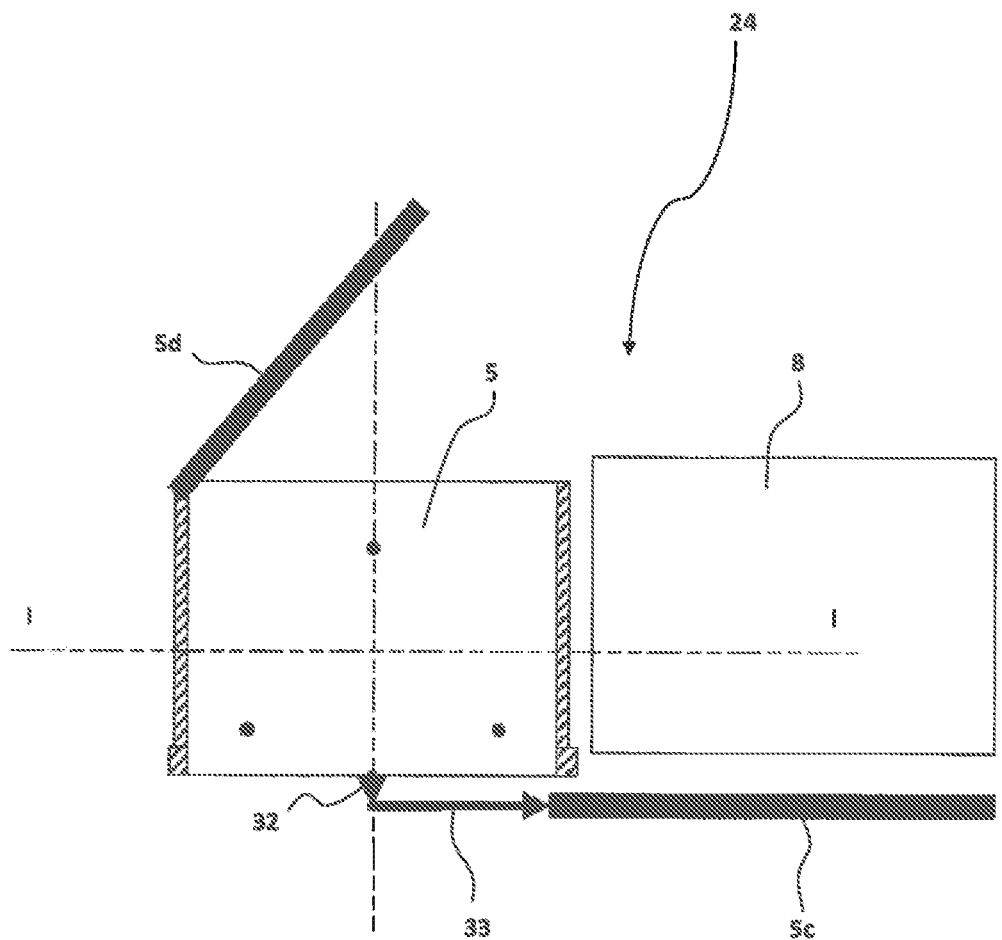
FIG. 8 is a plan view illustrating the details of the kinematics of the doors of a decontamination chamber of the treatment device of FIGS. 6 and 7.

Reference is now made to FIG. 8 which illustrates a first embodiment for moving the access door 5c of the decontamination chamber 5.

In this case, the access door 5c, driven by suitable actuating means, is moved in two perpendicular movements, namely a low-amplitude horizontal transverse first movement 32, toward and away from the opening of the decontamination chamber 5, and a longitudinal second movement 33, perpendicular to the first movement 32, to move the access door 5c horizontally from a position of engagement facing the opening of the decontamination chamber 5 and a wide open position away from the decontamination chamber 5, on the side of the pumping means 8. In that way, in the open position, the access door 5c does not impede the movement of the robot 29, does not disrupt access to the other decontamination chambers 5 positioned above or below, and does not add to the total space occupied by the treatment device 23.

FIGS. 9 and 10 illustrate a preferred embodiment of the means of moving the access door 5c. FIG. 9 illustrates the access door 5c in the closed state, while FIG. 10 illustrates the access door 5c in the open state.

In its longitudinal movement, the access door 5c is actuated by a sliding actuator 34, such a pneumatic ram. The access door 5c/pneumatic ram 34 assembly is mounted on a frame 35 itself mounted so that it can rotate about a posterior vertical axis 36 and rotationally driven by a pivoting actuator 37. Thus, the frame 35 can pivot between a closed position illustrated in FIG. 9, in which position the access door 5c is pressed firmly against the opening of the decontamination chamber 5, and an open position in which the frame 35 is away from the decontamination chamber 5.

Thus, the seals 38 and 38 provided on the access door 5c are able to seal against the decontamination chamber 5 without experiencing friction during opening and closing operations.

As may be seen from FIGS. 7 to 10, the maintenance door 5d is a swing door, opened manually.

FIGS. 9 and 10 illustrate another embodiment detail of the treatment device 23 according to one embodiment of the invention.

In this case, in the pumping means 8, it is possible to differentiate between a primary pump 8a pieced in a primary pumping compartment 8c, horizontally aligned with the decontamination chamber 5. The access door 5c in its open position moves on one side of the primary pumping compartment 8c, as can be seen in FIG. 10. On the opposite side of the primary pumping compartment 8c there is an electronic panel 8d containing the control means 14 that control the decontamination module 24. Thus, the control means 14 in the panel 8d do not increase the amount of vertical space occupied by the decontamination module 24-27, thus allowing four decontamination modules 24-27 to be stacked vertically in a clean room of a semiconductor manufacturing facility 200.

In the treatment device 23 illustrated in FIGS. 6 and 7, each decontamination module 24-27 comprises its own pumping means 8 having at last one primary pump 8a. In each decontamination module 24-27, the primary pump 8a is housed in the primary pumping compartment 8c (FIGS. 9 and 10) which is longitudinally offset from the decontamination chamber 5. For preference, the decontamination chamber 5 is closer to the loading-unloading stations 23a-23b, it being possible for the primary pumping compartment 8c to be offset away from the loading-unloading stations 23a-23b so as to reduce the longitudinal travel of the robot 29.

Figure 12:
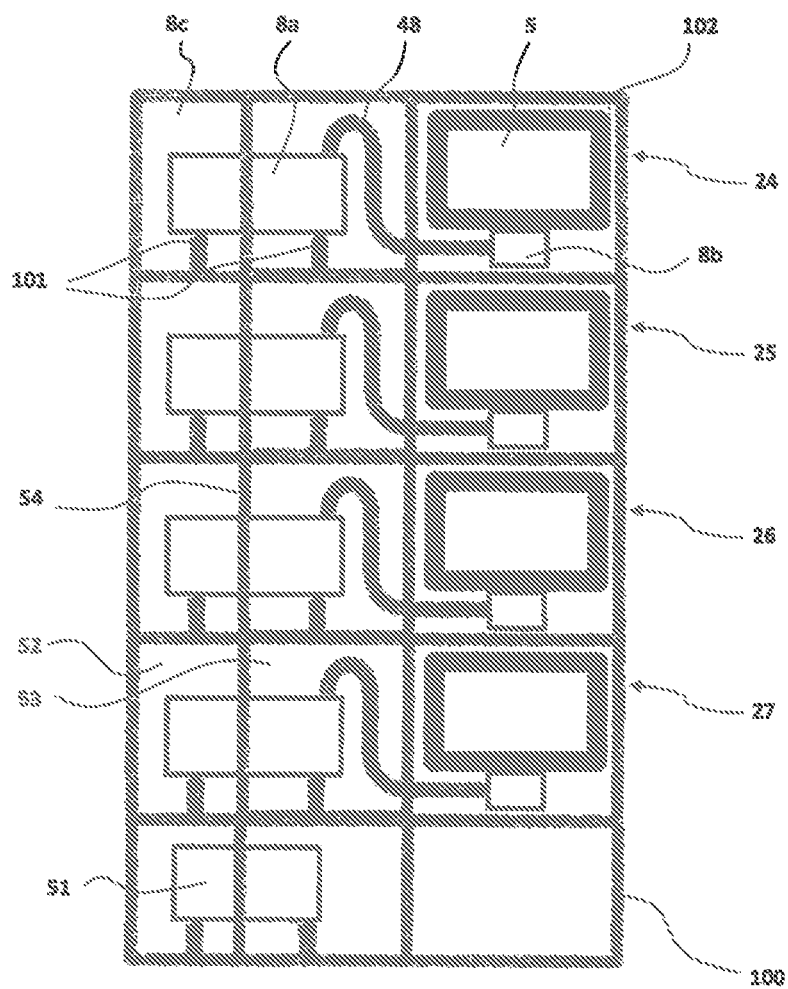
FIG. 12 is a schematic side view in cross section illustrating the general arrangement of the pumping means of the treatment device of FIGS. 6 and 7.

As illustrated schematically in FIG. 12, the decontamination modules 24-27 are supported by a common chassis 100. A separate chassis supports the robot 29 (not depicted) and the loading-unloading stations 23a-23b. The who entity is confined within a common casing.

Within the primary pumping compartment 8c, the primary pump 8a of each of the decontamination modules 24-27 is supported by the common chassis 100 with the interposition of elastic connecting means 101 preventing the transmission of vibration to the decontamination chamber 5. The decontamination chamber 5 is itself positioned in a decontamination chassis 102, which also carries the sensors and actuators associated with the decontamination chamber 5. The secondary pump 8b is advantageously positioned below the decontamination chamber 5, its suction inlet being connected directly to the inside of the decontamination chamber 5, its discharge outlet being connected by an intermediate line 48 to the suction inlet of the primary pump 8a. The same is true of the other decontamination modules 25-27.

Figure 3:
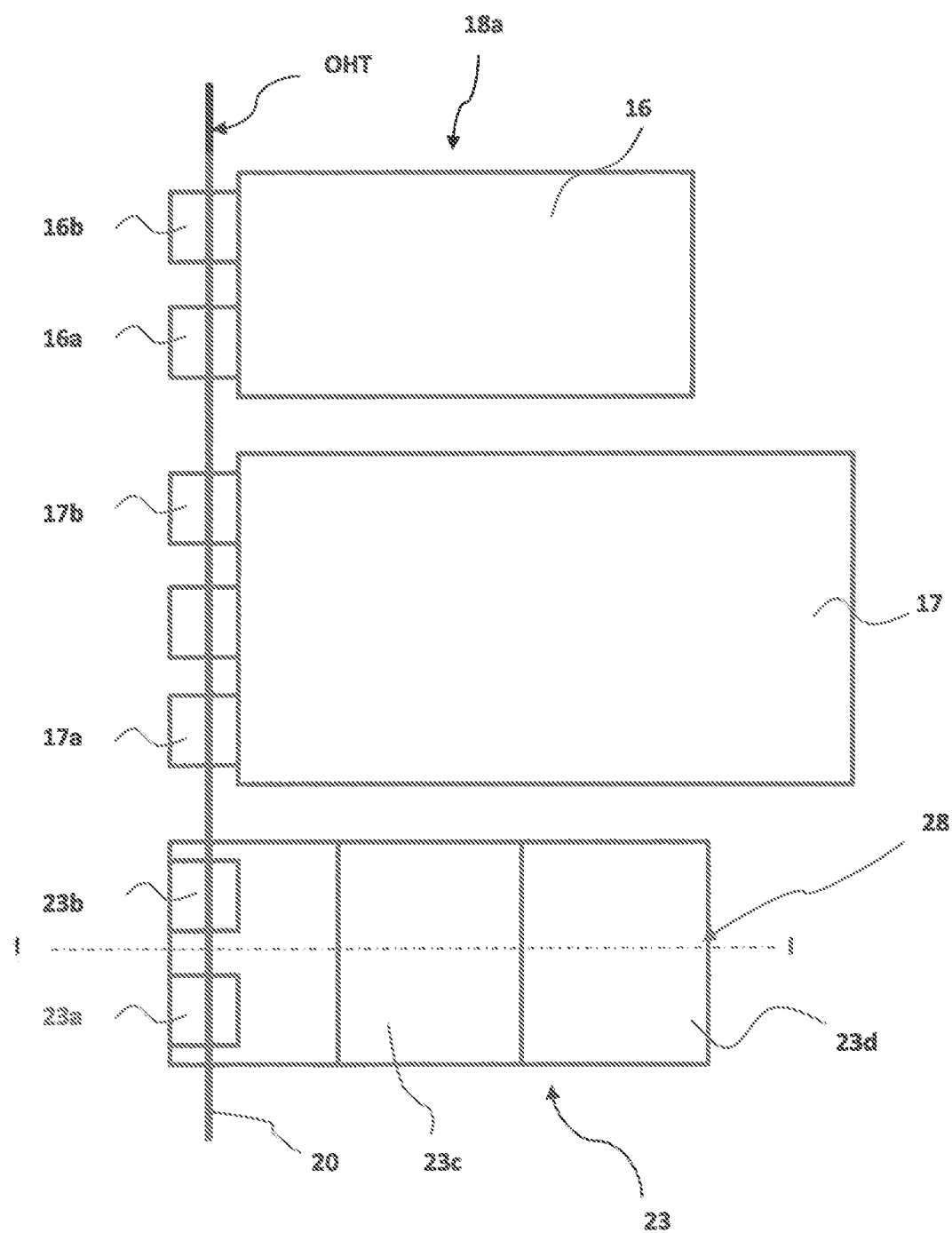

Reference is made again to FIG. 3. In this view from above, it is possible to make out the column of modules 23c comprising, as illustrated in FIGS. 6 and 7, a superposition of four decontamination modules 24-27. That makes it possible to obtain four times the throughput of one decontamination module. FIG. 3 illustrates a second column of decontamination modules 23d, that forms a second superposition of four decontamination modules like the modules 24-27 of FIGS. 6 and 7.

The two columns of decontamination modules 23c and 23d form a longitudinal row 28 of two columns 23c and 23d of decontamination modules superposed on one another, the row 28 of columns of modules extending in the longitudinal direction I-I perpendicular to the direction of travel of the branch 20 of the box transport system OHT. This then increases the number of decontamination modules 24-27 without increasing the space occupied by the treatment device 23 along the branch 20 of the box transport system OHT. Further, the depth available in the longitudinal direction I-I of the longitudinal row 28 of columns 23c, 23d of decontamination modules is also put to use.

Figure 4:
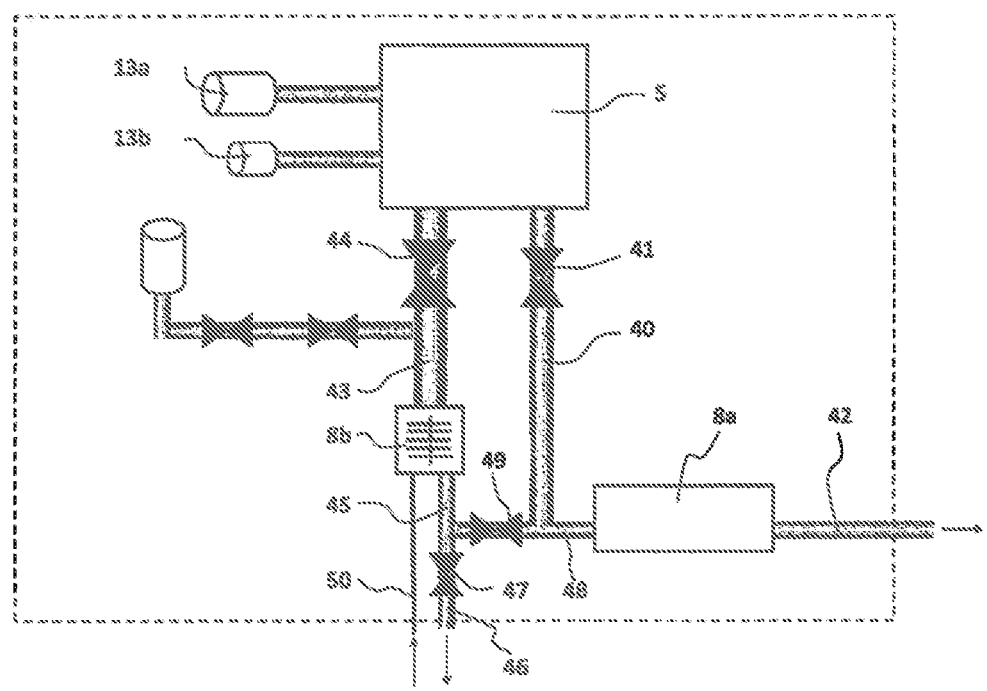
FIG. 4 is a schematic view illustrating the supply means and the pumping means associated with the decontamination chamber of a decontamination module according to one embodiment of the invention.

Reference is now made to FIG. 4 which schematically illustrates one possible functional arrangement of the pumping and supply means of the decontamination chamber 5. The decontamination chamber 5 is associated with two pressure gauges 13a and 13b. Gas sources (not depicted) are operated by the control device 14 (see FIG. 1) so as to introduce the gases at the appropriate moments during the course of the process.

The primary pump 8a is connected to the decontamination chamber 5 by a primary pumping line 40 associated with a primary control valve 41, discharging the pumping gases via an outlet line 42 to the semiconductor manufacturing facility gas extraction and/or treatment system.

The intake side of the secondary pump 8b is connected to the decontamination chamber 5 by a short secondary pumping line 43 fitted with a secondary control valve 44, and its discharge side discharges into a secondary discharge line 45 which is itself connected firstly to a transfer line 46 by a valve 47, and secondly to an intermediate line 48 which leads to the intake side of the primary pump 8a, with the interposition of a valve 49. A purge inlet 50 constantly introduces a purge gas into the secondary pump 8b. The transfer line 46 is connected to a primary pump 51 (FIG. 5) with low delivery, this pump being common to all the decontamination modules 24-27.

The secondary pump 8b is in constant rotation, constantly supplied with purge gas by the purge inlet 50, periodically supplied with treatment gas from the decontamination chamber 5, and discharging either into the transfer line 46 or into the intermediate line 48. As the pressure in the decontamination chamber 5 drops, a first, pre-emptying, phase is carried out by opening the primary control valve 41 so that only the primary pump 8a does the pumping, the secondary pump 8b being isolated by the secondary control valve 44 and by the valve 49. In this phase, the valve 47 is open so that the common primary pump 51 pumps to the discharge side of the secondary pump 8b. Beyond a fixed pressure threshold, a second emptying phase is undertaken, during which phase the primary control valve 41 is closed and the valves 44 and 49 are opened, allowing the two pumpings of the primary 8a and secondary 8b pumps to combine in series. During this phase, the valve 47 is closed to avoid contaminating the common primary pump 51 with the gases pumped from the decontamination chamber 5. The most independent possible operation between the various decontamination modules 24-27 is thus ensured.

Figure 5:
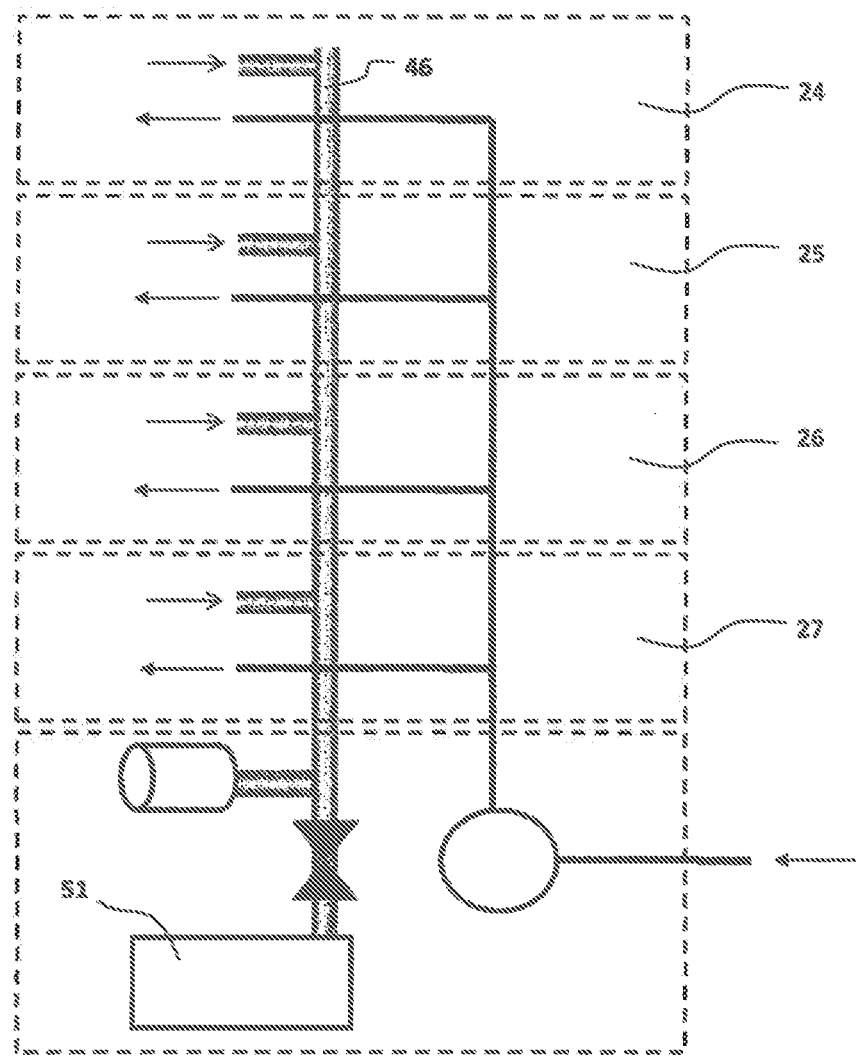
FIG. 5 is another block diagram of the supply and pumping means associated with the decontamination chambers of a treatment device according to the present invention.

Reference is now made to FIG. 5 which illustrates the common primary pump 51, connected by the transfer line 46, to all the secondary pumps 8b of the decontamination modules 24-27 of the treatment device 23.

Figure 11:
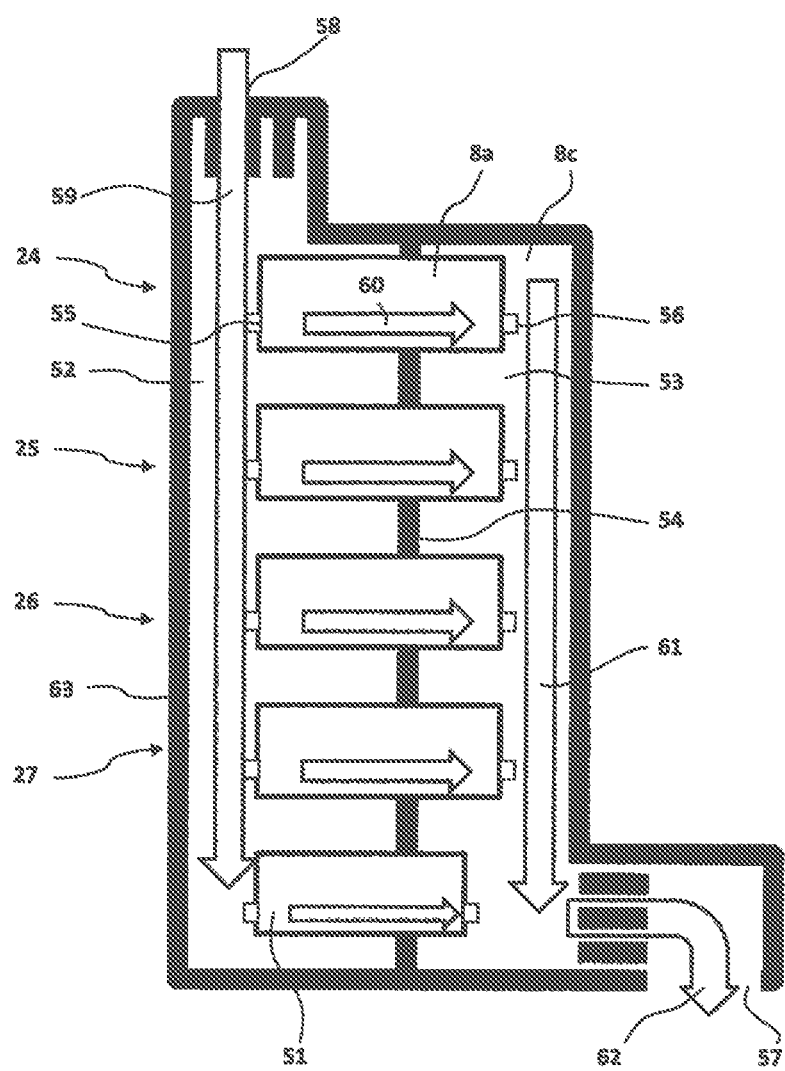
FIG. 11 is a schematic side view in cross section illustrating the ventilation system of the primary pumps of the treatment device according to one embodiment of the present invention.

Reference is now made to FIG. 11 which illustrates the ventilation means for thermally cooling the primary pumps, and the acoustic insulating means for insulating the treatment device according to one embodiment of the invention.

The primary pumps such as the primary pump 8a of the four decontamination modules 24-27 of the treatment device of FIGS. 6 and 7 has been illustrated schematically. The primary pump 8a is housed in its primary pumping compartment 8c. The primary pumping compartments such as the compartment 8c of the four decontamination modules 24-27 communicate with one another in the vertical direction and are each divided into two half-compartments forming a common intake compartment 52 and a common discharge compartment 53 which are separated from one another by an intermediate wall 54 through which the primary pumps 8a pass. The primary pumps such as the primary pump 8a themselves each comprise an air cooling system, with a cooling air intake 55 at a first end of the pump and with the cooling air discharge 56 at a second end of the pump.

Thus, the intermediate vertical wall 54 separates from one another a first pumping compartment zone, that receives all the cooling air discharges from the primary pumps and constitutes the common discharge compartment 53, and a second pumping compartment zone containing all the cooling air intakes of the primary pumps and that constitutes the common intake compartment 52.

The first pumping compartment zone that constitutes the common discharge compartment 53 has a lower air outlet 57. The second pumping compartment zone that constitutes the common intake compartment 52 has an upper ambient air inlet 58.

Thus, the primary pump cooling air flow is as indicated by the arrows 59, 60, 61 and 62, from the top downwards through the primary pumps 8a.

Also illustrated in FIG. 11 are acoustic insulation means that reduce the acoustic omissions towards the environment from the treatment device 23. For that, all of the primary pumping compartments are isolated by absorbent panels 63 used for sound insulation. The air circulation lower outlet 57 and upper net 58 are themselves fitted with baffles that absorb acoustic emissions.

The common primary pump 51 is also sited in one of the primary pumping compartments, to ensure that it is cooled and acoustically insulated in the same way as the other primary pumps.

A common control device manages the flow of transport and storage boxes 1 that are to be treated according to the availabilities of the decontamination chambers 5 and the treatment demands from the semiconductor manufacturing facility production supervisor, and thus manages the loading-unloading stations 23a, 23b, the movement of the robot 29, and the starting of the processes in the decontamination modules 24-27.

The common control device comprises means of communicating with the semiconductor manufacturing facility supervisor and with the box transport system OHT to allow the transport and storage boxes 1 to be loaded automatically onto the loading-unloading stations 23a, 23b.

The present invention is not restricted to the embodiments explicitly described but includes the various variations and generalizations that are within the competence of those skilled in the art.

The invention claimed is:

1. A device for treatment of transport and storage boxes, the treatment device comprising:
    a decontamination module, the decontamination module comprising:
        a decontamination chamber having a side access door capable of containing a transport and storage box;
        means for introducing gas into the decontamination chamber;
        vacuum pumping means for creating a vacuum inside the decontamination chamber;
        command and control means for controlling the gaseous atmosphere within the decontamination chamber;
    wherein the device further comprises:
        a plurality of decontamination modules supported by a common chassis;
        the decontamination modules are superposed on one another to form at least one column of modules;
        each decontamination module comprises its own vacuum pumping means having at least a primary pump;
        the primary pump is housed in a primary pumping compartment that is longitudinally offset with respect to the decontamination chamber;
        wherein the primary pumping compartments of the decontamination modules of one and the same column of modules communicate with one another with no horizontal separation;
        each primary pump comprises an air cooling system with a cooling air intake at a first end of the pump and with a cooling air discharge at a second end of the pump;
        the primary pumping compartments further comprise a first pumping compartment zone receiving all the cooling air discharges and comprising a lower air outlet and a second pumping compartment zone containing all the cooling air intakes and comprising an upper ambient air inlet, wherein the first pumping compartment zone and the second pumping compartment zone are within the primary pumping compartments; and
        an intermediate vertical wall within the primary pumping compartments that separates the first pumping compartment zone from the second compartment zone.

2. The device of claim 1 in which the primary pump is supported by the common chassis with the interposition of elastic connecting means preventing the transmission of vibration to the decontamination enclosure.

3. The device of claim 1 in which the side access doors of the decontamination modules are all oriented along one and the same access side and are each controlled by actuating means which open and close them.

4. The device of claim 1 in which the access door of each decontamination module is a sliding access door which, when open, is laterally offset to the side of the primary pumping compartment and which is controlled by a sliding actuator.

5. The device of claim 4, in which the sliding access door is mounted to slide longitudinally on a frame itself mounted with pivoting about a vertical axis of pivoting and made to pivot by a pivoting actuator.

6. The device of claim 3 in which each decontamination chamber of the decontamination modules comprises, on the opposite side to the access door, a maintenance door so that individual maintenance can be carried out on one decontamination module.

7. The device of claim 1 further comprising:
at least one loading unloading station;
a lateral transfer zone provided on the side of the access to the decontamination modules in line with the loading unloading station; and
a robot placed in the lateral transfer zone, capable of moving the transport and storage boxes between the loading unloading station and the decontamination chamber of each of the decontamination modules.

8. The device of claim 7, further comprising:
a first loading unloading station in line with the lateral transfer zone; and
a second loading unloading station in line with the longitudinal row of columns of modules and comprising means of longitudinal movement and means of rotating through 90° about a vertical axis.

9. The device of claim 6, further comprising:
at least one loading unloading station;
a lateral transfer zone provided on the side of the access to the decontamination modules in line with the loading unloading station; and
a robot placed in the lateral transfer zone, capable of moving the transport and storage boxes between the loading unloading station and the decontamination chamber of each of the decontamination modules and wherein each decontamination module comprises a safety device which locks the maintenance door if the side access door is opened, and/or locks the side access door and partially disables the robot if the maintenance door is opened.

10. The device of claim 1 in which:
each decontamination module comprises its own control means; and
the control means are arranged in a control panel positioned to the side on the same side as the primary pumping compartment.

11. A device for treatment of transport and storage boxes, the treatment device comprising:
a common chassis;
a plurality of decontamination modules supported by said common chassis, each of said plurality of decontamination modules superposed on one another to form at least one column of modules and each of said plurality of decontamination modules comprising:
a decontamination chamber having a side access door capable of containing a transport and storage box;
means for introducing gas into the decontamination chamber;
vacuum pumping means for creating a vacuum inside the decontamination chamber said vacuum pumping means having at least a primary pump wherein said primary pump is housed in a primary pumping compartment that is longitudinally offset with respect to said decontamination chamber;
command and control means for controlling the gaseous atmosphere within the decontamination chamber;

wherein the primary pumping compartments of the decontamination modules of one and the same column of modules communicate with one another with no horizontal separation;
each primary pump comprises an air cooling system with a cooling air intake at a first end of the pump and with a cooling air discharge at a second end of the pump;
the primary pumping compartments further comprise a first pumping compartment zone receiving all the cooling air discharges and comprising a lower air outlet and a second pumping compartment zone containing all the cooling air intakes and comprising an upper ambient air inlet, wherein the first pumping compartment zone and the second pumping compartment zone are within the primary pumping compartments; and
an intermediate vertical wall within the primary pumping compartments that separates the first pumping compartment zone from the second compartment zone.

12. The device of claim 11 further comprising elastic connecting means disposed between said primary pump and said common chassis so as to reduce the transmission of vibration to the decontamination enclosure.

13. The device of claim 11 in which the side access doors of said decontamination modules are all oriented along one and the same access side and are each controlled by actuating means which open and close them.

14. The device according to claim 13, in which each decontamination chamber of said decontamination modules comprises, on the opposite side to the access door, a maintenance door so that individual maintenance can be carried out on one decontamination module.

15. The device according of claim 11, in which the access door of each decontamination module is a sliding access door which, when open, is laterally offset to the side of the primary pumping compartment and which is controlled by a sliding actuator.

16. The device of claim 15, in which the sliding access door is mounted to slide longitudinally on a frame itself mounted with pivoting about a vertical axis of pivoting and made to pivot by a pivoting actuator.

17. The device of claim 11 further comprising:
at least one loading unloading station;
a lateral transfer zone provided on the side of the access to the decontamination modules, in line with said loading unloading station; and
a robot, disposed in the lateral transfer zone, capable of moving the transport and storage boxes between the loading unloading station and the decontamination chamber of each of the decontamination modules.

18. The device according of claim 17, further comprising:
a first loading unloading station in line with the lateral transfer zone; and
a second loading unloading station in line with the longitudinal row of columns of modules and comprising means of longitudinal movement and means of rotating through 90° about a vertical axis.

19. Treatment device of claim 14 further comprising:
at least one loading unloading station;
a lateral transfer zone provided on the side of the access to the decontamination modules, in line with said loading unloading station; and
a robot, disposed in the lateral transfer zone, capable of moving the transport and storage boxes between the loading unloading station and the decontamination chamber of each of the decontamination modules; and where each of said decontamination modules comprises a safety device which locks the maintenance door if the side access door is opened and/or locks the side access door and partially disables the robot if the maintenance door is opened.

20. The device according to claim 11 wherein each of said decontamination modules comprises its own control means and wherein said control means are arranged in a control panel positioned to the side on the same side as the primary pumping compartment.

\* \* \* \* \*